United States Patent

Yang et al.

Patent Number: 5,965,461
Date of Patent: Oct. 12, 1999

[54] CONTROLLED LINEWIDTH REDUCTION DURING GATE PATTERN FORMATION USING A SPIN-ON BARC

[75] Inventors: Chih-Yuh Yang; Scott A. Bell; Daniel Steckert, all of San Jose, Calif.

[73] Assignee: Advanced Micro Devices, Inc., Sunnyvale, Calif.

[21] Appl. No.: 08/905,109

[22] Filed: Aug. 1, 1997

[51] Int. Cl.⁶ ................................................. H01L 21/302
[52] U.S. Cl. ........................ 438/717; 438/725; 438/734; 438/952
[58] Field of Search .................... 438/717, 696, 438/725, 719, 736, 952, 734

[56] References Cited

U.S. PATENT DOCUMENTS

| | | | |
|---|---|---|---|
| 5,392,124 | 2/1995 | Barbee et al. | 356/381 |
| 5,431,770 | 7/1995 | Lee et al. | 156/653.1 |
| 5,545,578 | 8/1996 | Park et al. | 437/44 |
| 5,567,631 | 10/1996 | Hsu et al. | 437/32 |
| 5,580,700 | 12/1996 | Rahman | 430/311 |
| 5,600,165 | 2/1997 | Tsukamoto et al. | 257/323 |
| 5,620,912 | 4/1997 | Hwang et al. | 438/301 |
| 5,804,088 | 9/1998 | Mckee | 216/47 |

FOREIGN PATENT DOCUMENTS

| | | |
|---|---|---|
| 0753763 | 1/1997 | European Pat. Off. . |
| 0753885 | 1/1997 | European Pat. Off. . |
| 0753764 | 11/1997 | European Pat. Off. . |

OTHER PUBLICATIONS

G.V. Thakar, V.M. McNeil, S.K. Madan, B.R. Riemenschneider, D.M. Rogers, J.A. McKee, R. H. Eklund and R.A. Chapman, "A Manufacturable High Performance Ouarter Micron CMOS Technolgy Using I–Line Lithography and Gate Linewidth Reduction Etch Process", IEEE 1996, p. 216–217.

Wei W. Lee, Qizhi He, Maureen Hanratty, Dary Rogers, Amitava Chatterjee, Robert Kraft and Richard A. Chapman, "Fabrication of 0.06 um Poly–Si Gate Using DUV Lithography With a Designed $Si_xO_yN_z$ Film as an Arc and Hardmask", IEEE, Jan., 1997, p. 131–132.

*Primary Examiner*—William Powell
*Assistant Examiner*—George Goudreau

[57] ABSTRACT

A gate is formed by depositing a gate conductive layer over a substrate layer, depositing an organic spin-on bottom anti-reflective coating (BARC) over the gate conductive layer, and forming a resist mask on the BARC. Next, the resist mask is controllably etched to further reduce the critical dimensions of gate pattern formed therein, and then the gate is formed by etching the gate conductive layer using the reduced size resist mask.

20 Claims, 1 Drawing Sheet

CONTROLLED LINEWIDTH REDUCTION DURING GATE PATTERN FORMATION USING A SPIN-ON BARC

TECHNICAL FIELD

The present invention relates to semiconductor devices and manufacturing processes, and more particularly to methods for forming conductive gates within a semiconductor device using a spin-on bottom anti-reflective coating (BARC) and a photoresist mask.

BACKGROUND ART

A continuing trend in semiconductor technology is to build integrated circuits with more and/or faster semiconductor devices. The drive toward this ultra large scale integration has resulted in continued shrinking of device and circuit dimensions and features. In integrated circuits having field-effect transistors, for example, one very important process step is the formation of the gate for each of the transistors, and in particular the dimensions of the gate. In many applications, the performance characteristics (e.g., switching speed) and size of the transistor are functions of the size (e.g., width) of the transistor's gate. Thus, for example, a narrower gate tends to produce a higher performance transistor (e.g., faster) that is inherently smaller in size (e.g., narrower width).

As is often the case, however, there are limitations to existing techniques that reduce their effectiveness or even exclude their use in fabricating the next generation of integrated circuit devices. For example, the limitations of conventional lithographic techniques and tools, which are used to pattern the gates during fabrication, are quickly being realized. Accordingly, there is a continuing need for more efficient and effective fabrication processes for forming transistor gates that are smaller and/or exhibit higher performance.

SUMMARY OF THE INVENTION

The present invention provides methods for forming a gate or other conductive line on a semiconductor substrate. The methods use an organic bottom anti-reflective coating (BARC) to form an initial resist mask, and an additional etching process to further trim the features of the resist mask before etching through one or more underlying layers in a wafer stack.

Thus, in one embodiment of the present invention, a method is provided for forming a gate structure from a semiconductor wafer stack. The method includes depositing an organic BARC on a conductive layer. Next, the method includes depositing a resist layer on the BARC, and forming a first resist mask with the resist layer using the BARC to provide increased process control. The first resist mask includes at least one initial line having an initial width. The method then includes forming a second resist mask by isotropically etching the first resist mask, such that portions of the initial line are removed to form a final line having a final width. As such, the final width is narrower than the initial width. Next, the method includes etching through selected portions of the gate conductive layer to form a gate from the gate conductive layer. The result is that the gate has a width substantially equal to the final width of the final resist mask as previously patterned. As such, in certain embodiments, the resulting gate is advantageously narrower than the reliable patterning limitations of the lithographic technology applied during the formation of the initial resist mask.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drown to scale, but instead are drawn so as to illustrate the important features of the present invention.

In accordance with the present invention, there are provided a methods for forming at least one gate within an integrated circuit using an organic, spin-on film as a bottom anti-reflective coating (BARC), and a trim etch process that controllably trims or reduces the critical dimension (CD) of the gate pattern in the resist mask. By reducing the CD of the initial gate pattern, the methods of the present invention allow smaller gates to be formed and thereby extend the capabilities of typical lithographic techniques beyond their current resolution limitations.

Figure 1:
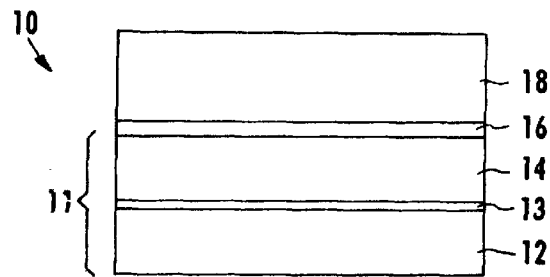
FIG. 1 depicts a cross-section of a portion of a semiconductor wafer that has been prepared for gate conductor formation, in accordance with an embodiment of the present invention.

With this in mind, FIG. 1 depicts a cross-section of a portion 10 of a semiconductor device being fabricated on a semiconductor wafer, in accordance with the present invention. Portion 10 includes a wafer stack 11 having a plurality of layers including a substrate 12 and a gate conductive layer 14. As depicted, there is also a BARC 16 and a resist layer 18. BARC 16 is preferably a conventional spin-on organic material, such as, for example, polymides, polysulfones, and/or the like, that forms a thin film over gate conductive layer 14. Organic materials, such as these, and techniques for applying them in thin films are well known to those skilled in the art. Resist layer 18, in certain embodiments, is a conventional deep-UV resist material applied to BARC 16 using conventional techniques. In accordance with one embodiment of the present invention, substrate 12 includes a silicon layer, approximately 2 mm thick. Additionally, portion 10 preferably includes a thin oxide layer 13 that acts as a barrier between gate conductive layer 14 and the lower portions of substrate 12. For example, in one embodiment of the present invention, thin oxide layer 13 is an oxide film that is approximately 55Å thick. Gate conductive layer 14, in one embodiment, is a layer of polycrystalline silicon, approximately 1,700Å thick, which is formed on top of substrate 12.

Figure 2:
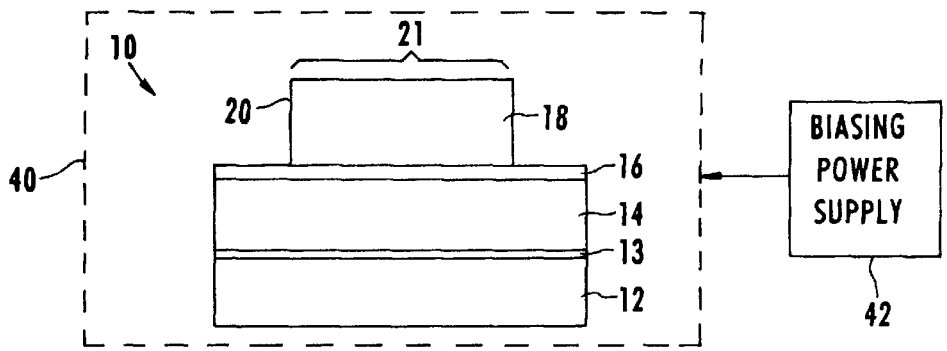
FIG. 2 depicts the portion of FIG. 1 following formation of an initial resist mask, in accordance with an embodiment of the present invention.

BARC 16 is preferably configured, or tuned, to suppress interference waves and/or standing waves associated with a particular wavelength, which are often produced by one or more underlying layers during the patterning of resist layer 18 to form an initial resist mask 20, as in FIG. 2. Without BARC 16, the interference waves tend to limit the patterning and resolution capabilities of the resist mask. For example, BARC 16, in accordance with one embodiment of the present invention, is tuned through process conditions to absorb deep-UV wavelengths (e.g., 248 nm) during the creation of initial resist mask 20 using conventional deep-UV lithography techniques.

Thus when combined with the proper lithographic techniques, BARC 16 allows for better process control in the resist patterning which allows for the subsequent formation of smaller gates.

Figure 3:
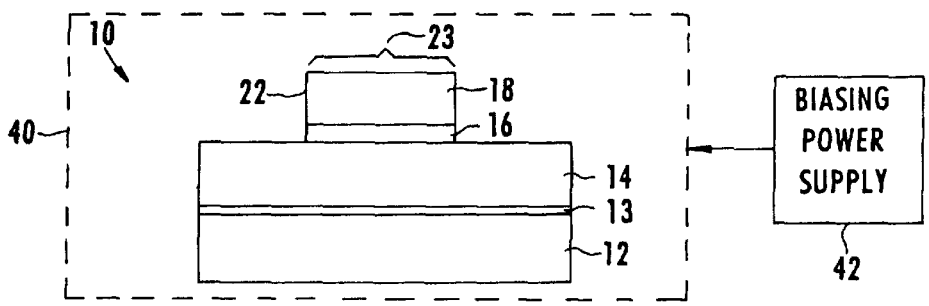
FIG. 3 depicts the portion of FIG. 2 following a trim etch process that trims the initial resist mask into a final resist mask, in accordance with an embodiment of the present invention.
Figure 4:
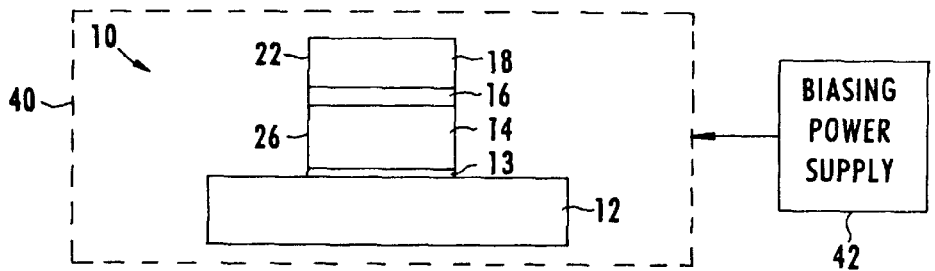
FIG. 4 depicts the portion of FIG. 3 following a gate conductive layer etching process, in accordance with an embodiment of the present invention.

In FIGS. 2 through 4, portion 10 is depicted within a dashed line box that represents a reactor chamber 40 in which the etching processes of the present invention are conducted. Additionally, a biasing power supply 42 is depicted as a block diagram in FIGS. 2 through 4. Biasing power supply 42 is a conventional power supply that is configured to supply electrical power to the plasma reactor during certain etching processes.

As shown in FIG. 2, initial resist mask 20 has an initial line width 21. In accordance with the present invention, the initial line width 21 of the initial resist mask 20 is wider than the desired gate to be formed. As such, a trim etch process is required, in accordance with the present invention, to further reduce the initial line width 21 to match the desired gate width. For example, a typical deep-UV stepper in certain embodiments provides reliable resolution capabilities down to approximately 0.25 microns. To provide for a gate width that is less than 0.25 microns, such as, 0.18, 0.15 or narrower, the 0.25micron wide initial line is controllably etched until a 0.18, 0.15 or narrower final line remains.

Thus, the trim etch process, in accordance with one embodiment of the present invention, includes isotropically etching away a portion of initial resist mask 20 and BARC 16 to produce a final resist mask 22, as depicted in FIG. 3, that has a final line width 23 that is approximately equal to the desired gate width.

The novel trim etch process etching recipe, in accordance with the present invention, is preferably used to controllably etch a semiconductor wafer as described above within a plasma etching tool, such as, a reactive ion etching (RIE) plasma system, for example, an AMAT P5000 available from Applied Materials of Santa Clara, Calif. However, those skilled in the art will recognize that the various parameters associated with the etching process and recipe are adjustable for differing arrangements, semiconductor wafers, layer stacks, layer materials, etching tools, and other common semiconductor manufacturing apparatus. For example, the etching recipe of the present invention is readily adaptable for use in a high density plasma etching system, such as, for example, the AMAT DPS system available from Applied Materials, or a LAM TCP system available from LAM Research of Fremont, Calif. It is further recognized that the present invention can be practiced with or without all of the parameters being adjusted or provided as described herein.

The trim etch process, in accordance with one embodiment of the present invention, preferably includes isotropically etching away portions of initial resist mask 20 using a mixture of HBr and $O_2$.

By way of example, in one embodiment an AMAT MxP5000 RIE plasma system is supplied with a mixture of gases at a rate that is preferably between approximately 30 to 80 sccm. This preferred gas mixture includes between approximately 10 to 30 sccm of HBr and 20 to 50 sccm of $O_2$, and more preferably approximately 15 sccm of HBr and 45 sccm of $O_2$. Additionally, in this embodiment, a biasing power of approximately 300 Watts (W) is also supplied to reactor chamber 40. It is also preferred that the pressure in reactor chamber 40 be maintained at approximately 100 mT.

FIG. 4 depicts portion 10 of FIG. 3 following a gate conductive layer etching process in which exposed portions of gate conductive layer 14 are etched away. As depicted, the gate conductive layer etching process, which is preferably an anisotropic etching process, removed the exposed portions of gate conductive layer 16 and stopped on substrate 12. Thus, for example, if gate conductive layer 14 is a layer of polysilicon then the gate conductive layer etching process will preferably have a high-selectivity to the material on top of substrate 12, such as, for example, an oxide layer. The result of the gate conductive layer etching process is that a gate 26 is formed having substantially the same width as final line width 23.

Figure 5:
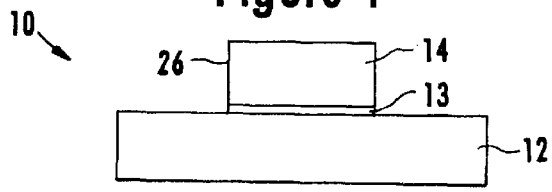
FIG. 5 depicts the portion of FIG. 4 following a resist mask removal process, in accordance with an embodiment of the present invention.

Next, in FIG. 5, portion 10 of FIG. 4 has had the remaining portions of final resist mask 22 and BARC 16 removed, for example, using a conventional resist stripping technique. As a result, gate 23 is fully exposed and can then be used to form completed transistors in subsequent fabrication processes.

Thus, the use of an organic spin-on BARC and a trim etch process, in accordance with the present invention, allows for a gate having a smaller CD which tends to translate to improved performance and increased circuit density beyond the limits of current lithography. Moreover, the various embodiments of the present invention use a known technology, that is conventional spin-on BARC materials and processes, to provide a reliable and/or predictable BARC layer. Thus, by using a spin-on BARC, the complexity of the gate patterning/formation process is not overly burdened and the number of etching processes tend to be minimized. For example, in certain embodiments of the present invention, spin-on BARC 16 is etched in the same etching process as resist layer 18.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for forming a gate structure from a semiconductor wafer stack comprising a substrate and a conductive layer above the substrate, the method comprising:

depositing an organic bottom anti-reflective coating (BARC) on the conductive layer;

depositing a resist layer on the BARC;

forming a first resist mask with the resist layer, wherein the first resist mask defines a first line having a first width;

isotropically etching using a plasma comprised of HBr plus $O_2$ the first resist mask to create a second mask, such that portions of the first line are removed to form a second line having a second width, wherein the second width is narrower than the first width;

etching through selected portions of the gate conductive layer as defined by the second resist mask to form a gate from the gate conductive layer, wherein the gate has a gate width substantially equal to the second width.

2. The method as recited in claim 1, wherein the gate conductive layer includes a polycrystalline silicon layer.

3. The method as recited in claim 1, wherein the BARC is configured to attenuate interference waves produced in forming the first resist mask.

4. The method as recited in claim 3, wherein the first resist mask is formed using deep-UV wave forms and the BARC attenuates interference waves having an approximate wavelength of 248 nm.

5. The method as recited in claim 1, wherein the step of isotropically etching the first resist mask to create a second mask includes a trim etch process in a plasma etching system.

6. The method as recited in claim 5, wherein the plasma etching system is a reactive ion etching system.

7. The method as recited in claim 6, wherein a mixture of gases supplied to a reactor within the plasma etching system includes approximately 10 to 30 sccm of HBr and approximately 20 to 50 sccm of $O_2$.

8. The method as recited in claim 7, wherein the mixture of gases includes approximately 15 sccm of HBr and approximately 45 sccm of $O_2$.

9. The method as recited in claim 6, wherein a reactor within the reactive ion etching system is supplied with a biasing power of approximately 300 Watts, during the trim etch process.

10. The method as recited in claim 6, wherein a reactor within the reactive ion etching system has a pressure that is maintained at approximately 100 mT, during the trim etch process.

11. The method as recited in claim 1, further comprising removing the second resist mask and BARC from the gate.

12. The method as recited in claim 1, wherein the resist layer is a spin-on resist layer that comprises polymides.

13. The method as recited in claim 1, wherein the resist layer is a spin-on resist layer that comprises polysulfones.

14. A method for forming a gate on a semiconductor wafer using a bottom anti-reflective coating and a trim etch process, the method comprising:

creating a wafer stack by forming a gate conductive layer over a substrate, depositing an organic bottom anti-reflective coating (BARC), and forming a resist mask on the BARC;

isotropically etching using a plasma comprised of HBr plus $O_2$ the resist mask and BARC to reduce a width of a gate line pattern formed in the resist mask; and shaping the wafer stack using the isotropically etched resist mask by etching through exposed portions of the gate conductive layer.

15. The method as recited in claim 14, wherein the gate conductive layer includes a polycrystalline silicon layer, approximately 1,700Å thick.

16. The method as recited in claim 14, wherein the first resist mask is formed using deep-UV wave forms and the BARC attenuates interference waves having an approximate wavelength of 248 nm.

17. The method as recited in claim 14, wherein the ratio of HBr to $O_2$ is between approximately 1:2 and 1:3.

18. The method as recited in claim 14, further comprising removing the resist mask and BARC from the gate.

19. The method as recited in claim 14, wherein the resist mask comprises polymides.

20. The method as recited in claim 14, wherein the resist mask comprises polysulfones.

* * * * *